(12) United States Patent
Smith et al.

(10) Patent No.: US 10,452,797 B2
(45) Date of Patent: Oct. 22, 2019

(54) FAULT INSERTION FOR SYSTEM VERIFICATION

(71) Applicant: Synopsys, Inc., Mountain View, CA (US)

(72) Inventors: Michael Smith, Portland, OR (US); David Smith, Beaverton, OR (US); Mohammad Omair Abbasi, Beaverton, OR (US); Vivian An, Portland, OR (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/530,359

(22) Filed: Oct. 31, 2014

(65) Prior Publication Data

US 2015/0161306 A1  Jun. 11, 2015

Related U.S. Application Data

(60) Provisional application No. 61/913,225, filed on Dec. 6, 2013.

(51) Int. Cl.
 *G06F 17/50* (2006.01)
(52) U.S. Cl.
 CPC ...... *G06F 17/5022* (2013.01); *G06F 17/5036* (2013.01)
(58) Field of Classification Search
 CPC .................. G06F 17/5022; G06F 17/5036
 USPC ......................................................... 716/106
 See application file for complete search history.

(56) References Cited

U.S. PATENT DOCUMENTS

| | | | | |
|---|---|---|---|---|
| 5,867,399 A | * | 2/1999 | Rostoker | G01R 31/31704 714/E11.167 |
| 6,102,964 A | * | 8/2000 | Tse | G01R 31/3177 716/116 |
| 6,134,705 A | * | 10/2000 | Pedersen | G01R 31/3177 714/E11.118 |
| 6,321,369 B1 | * | 11/2001 | Heile | G01R 31/3177 716/102 |
| 6,490,717 B1 | * | 12/2002 | Pedersen | G01R 31/3177 714/E11.118 |
| 7,236,917 B1 | * | 6/2007 | Nouri | G06F 17/5022 703/14 |
| 7,447,621 B1 | * | 11/2008 | Lam | G06F 17/5022 703/22 |
| 7,886,251 B2 | * | 2/2011 | Wen | G06F 17/505 716/100 |
| 8,281,274 B1 | * | 10/2012 | Padalia | G06F 17/5054 716/116 |
| 8,539,418 B1 | * | 9/2013 | Padalia | G06F 17/5054 716/121 |
| 2006/0218512 A1 | * | 9/2006 | Arslan | G06F 17/5045 716/102 |
| 2006/0265674 A1 | * | 11/2006 | Scheffer | G06F 17/5081 716/52 |
| 2006/0277512 A1 | * | 12/2006 | Kucukcakar | G06F 17/5068 716/112 |

(Continued)

*Primary Examiner* — Stacy Whitmore
(74) *Attorney, Agent, or Firm* — Alston & Bird LLP

(57) ABSTRACT

A computer implemented method of modifying a compiled design of an electronic circuit is disclosed. The method includes accessing a stored compilation representing the design, and causing the computer to generate a modified version of the stored compilation in response to an indication of a change to a portion of the design.

16 Claims, 8 Drawing Sheets

(56) References Cited

U.S. PATENT DOCUMENTS

| | | | |
|---|---|---|---|
| 2007/0005323 A1* | 1/2007 | Patzer | G01R 31/318357 703/14 |
| 2007/0033560 A1* | 2/2007 | Johnston | G06F 17/505 716/114 |
| 2007/0143093 A1* | 6/2007 | Alvey | G06F 11/3696 703/22 |
| 2008/0059925 A1* | 3/2008 | Seigler | G06F 17/504 716/103 |
| 2008/0059932 A1* | 3/2008 | Pfeil | G06F 17/50 716/137 |
| 2008/0270954 A1* | 10/2008 | Habib | G01R 31/31704 716/106 |
| 2008/0295056 A1* | 11/2008 | Wen | G06F 17/505 716/116 |
| 2009/0007058 A1* | 1/2009 | Dharmagadda | G06F 17/5045 717/104 |
| 2009/0083690 A1* | 3/2009 | Habib | G06F 17/5072 716/104 |
| 2009/0177459 A1* | 7/2009 | Durand | G06F 11/261 703/28 |
| 2010/0023308 A1* | 1/2010 | Willis | G06F 17/5036 703/13 |
| 2010/0058269 A1* | 3/2010 | Baker | G06F 17/505 716/122 |
| 2010/0107130 A1* | 4/2010 | Bowers | G06F 17/5045 716/106 |
| 2010/0293512 A1* | 11/2010 | Buck | G06F 17/5045 716/132 |
| 2012/0054698 A1* | 3/2012 | Arbel | G06F 17/505 716/102 |
| 2012/0192129 A1* | 7/2012 | Bowers | G06F 17/505 716/102 |
| 2012/0216091 A1* | 8/2012 | Blostic | G01R 31/318364 714/741 |
| 2012/0239370 A1* | 9/2012 | Yen | G06F 17/5022 703/13 |
| 2013/0080987 A1* | 3/2013 | Kipper | G06F 17/5031 716/113 |
| 2013/0096901 A1* | 4/2013 | Gellerich | G06F 17/504 703/13 |
| 2013/0111423 A1* | 5/2013 | Xia | G06F 8/43 716/103 |
| 2013/0173223 A1* | 7/2013 | Teller | G06F 17/5004 703/1 |
| 2013/0346593 A1* | 12/2013 | Setlur | H04L 29/14 709/224 |
| 2014/0282312 A1* | 9/2014 | Stamness | G06F 17/505 716/106 |
| 2015/0051890 A1* | 2/2015 | Saha | G06F 8/35 703/6 |
| 2015/0067622 A1* | 3/2015 | Goswami | G06F 17/5081 716/106 |
| 2015/0161306 A1* | 6/2015 | Smith | G06F 17/5036 716/106 |
| 2015/0178426 A1* | 6/2015 | Stamness | G06F 17/505 716/103 |
| 2015/0234946 A1* | 8/2015 | Teller | G06N 99/005 703/1 |
| 2015/0310154 A1* | 10/2015 | Bobok | G06F 17/5022 716/106 |

\* cited by examiner

FAULT INSERTION FOR SYSTEM VERIFICATION

REFERENCES TO RELATED APPLICATIONS

This application claims benefit under 35 USC 119 (e) of U.S. provisional Application No. 61/913,225, filed on Dec. 6, 2013, the contents of all of which are incorporated herein by reference in their entirety.

BACKGROUND

The present invention relates generally to a computer implemented method and system for verifying a design and in particular to inserting a multitude of faults during a computer simulation to verify a system design.

Electronics play an ever more important role, for example, in today's world of automobiles. Today, electronics makes up nearly 40% of the content of an average new automobile and the share of electronics is expected to grow higher. According to one study, an average new automobile includes more than 40 electronic controllers, five miles of wiring, and more than 10 million lines of computer software code. With this proliferation of electronics the risk due to electronics failures are also increasing rapidly. Failures in electronics of these vehicles may have a hazardous affect on the vehicle. Consequences of failures associated with automobile electronics include accidents and recalls.

Automobile makers face a difficult task of assuring the safety and reliability of the electronic components of their vehicles. Today most makers rely on electrical testing of their systems which is very costly, time consuming, and cannot cover all the possible fault conditions and their potential impact on the system.

Conventional computer aided design (CAD) fault simulators may be used to introduce fault elements as changes into the design description. However, because of limited ability of the user to interact with the simulation during runtime, every design change requires time consuming recompilation of the simulation. Robust fault simulation capability within the simulation environment is needed so that designers and verification engineers may simulate different types of faults and understand the impact of faults before prototypes for physical testing are built.

SUMMARY

One inventive aspect is a computer implemented method of modifying a compiled design of an electronic circuit. The method includes accessing a stored compilation representing the design, and causing the computer to generate a modified version of the stored compilation in response to an indication of a change to a portion of the design.

Another inventive aspect is a system for verifying a design, the system including a processor, and a memory storing a set of instructions. When executed by the processor instructions configure the processor to access a stored compilation representing the design, and cause the processor to generate a modified version of the stored compilation in response to an indication of a change to a portion of the design.

Another inventive aspect is a computer readable medium including instructions, which, when executed by the computer, cause the computer to perform a method the method includes accessing a stored compilation representing the design, and generating a modified version of the stored compilation in response to an indication of a change to a portion of the design.

BRIEF DESCRIPTION OF THE DRAWINGS

Various embodiments of the invention are disclosed in the following detailed description and the accompanying drawings.

DETAILED DESCRIPTION

Figure 1:
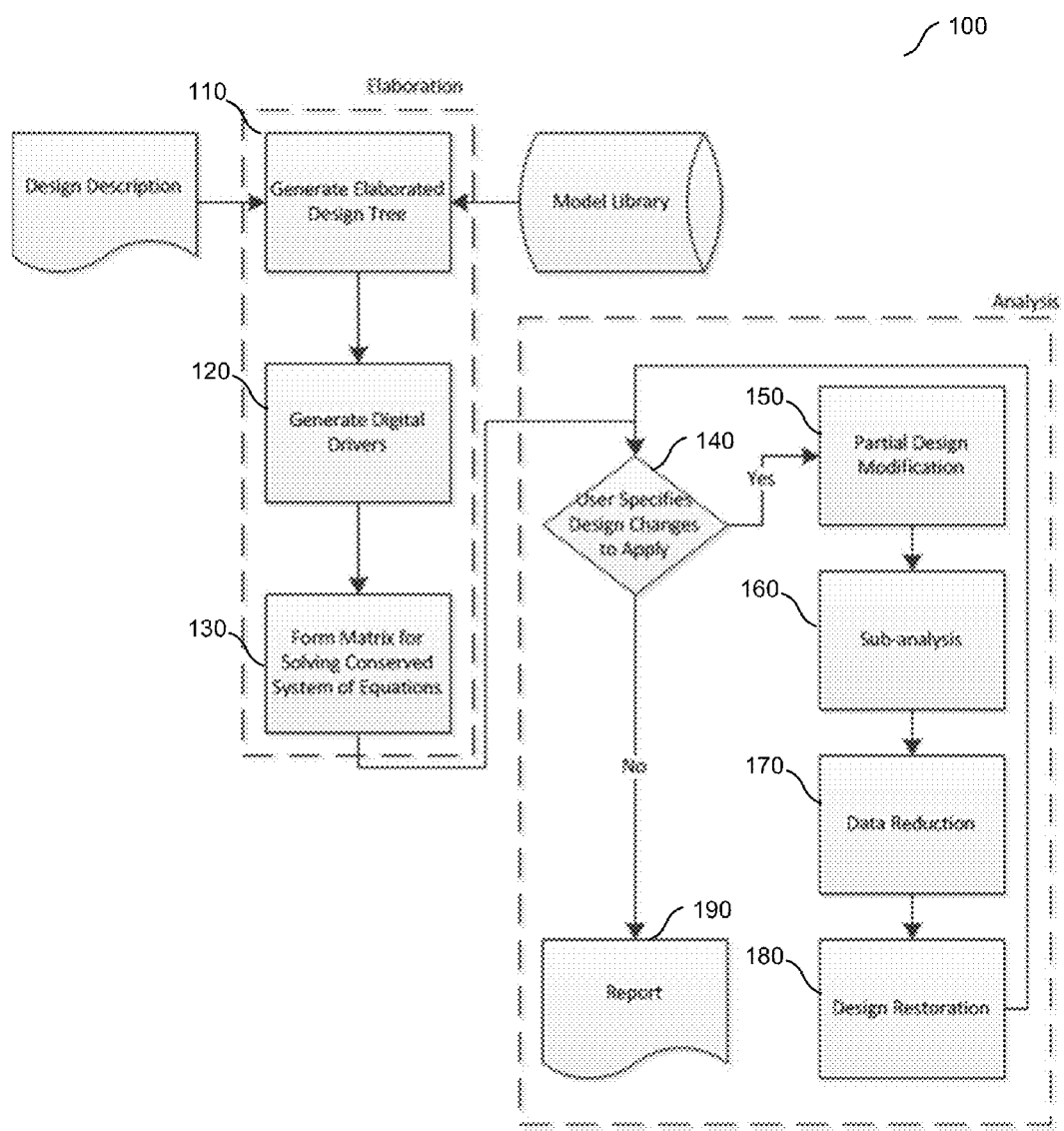
FIG. 1 depicts a simplified flow chart for verifying a design, in accordance with one embodiment of the present invention.

FIG. 1 depicts a simplified flow chart 100 for verifying a design, in accordance with one embodiment of the present invention. Flow chart 100 may include a robust fault simulation capability within the simulation environment so that designers and verification engineers may simulate different types of faults and understand the impacts of those faults before costly prototypes are built. Embodiments of the method depicted in flow chart 100 may, for example, be included in a software tool called Saber® HDL Simulator and/or Saber® Simulator marketed by Synopsys, Inc. Embodiments of the method may be performed by a computer running software instructions configured to cause the computer to be or function as a fault simulator.

The fault simulator receives a design description, hereinafter also referred to as a "design", which may, for example, be represented as a graphical schematic or as a description written in a hardware design language (HDL) such as VHDL, VHDL-AMS, Verilog-AMS, MAST, Modelica, and/or the like. The design may describe, for example, an electronic circuit, an electromechanical system, a mechanical system represented by mathematical descriptions of their physical behavior, hereinafter also referred to as "models", and/or any system that lends itself to be characterized by a combination of conserved, signal flow, and event or digital system of equations. The design may include a reusable description of an element that is used or instantiated multiple times throughout the design, with different parameters set for each use. For example, a resistor element may include a resistance parameter and the resistor may be instantiated multiple times with different resistance values in each instance of the resistor. A single use of an element within the design is called an instance of that element. A description of an element may be hierarchical, where the description includes instances of other elements.

The fault simulator elaborates the design. In some systems, prior to elaboration the design is represented in the form of a syntax tree that includes different parts of the design and the links between them but does not include the effects of those parts on the whole design when they are connected together. The simulator creates this syntax tree by analyzing the input design description.

Elaboration may include the process of interpreting or transforming the design description to generate a complete representation of the design after applying the effects of the element parameters chosen. For example, the elaboration may include deciding which element to instantiate in a hierarchical design. Part of the elaborated design representation is in memory for objects that may change during simulation. At 110, the elaboration interprets the elements of a design to form a compilation of the design. The compilation may be stored as a file in a computer readable memory. The compilation includes a design tree also referred to as an "elaborated design instance tree" or instantiated tree" that represents the design hierarchy. The instantiated tree is where information may be stored that can change during simulation of the design. The instantiated tree includes a projection of the element for each instance, with the projection containing the results of applying the specific parameters specified for that instance of the element. Other transformations may also be made to the design, with examples of transformations applicable to the VHDL-AMS language described in Section 12 of IEEE Std 1076.1-2007, which is incorporated by reference in its entirety.

Elaboration may use elements from a model library. Designs may use existing models that were not created solely for the design being simulated. Re-use of portions of designs or models may be facilitated by storing the portions of designs or models in the model library that may be referenced during elaboration of the design.

Elaboration further provides signals and their connections, representing the digital behavior and function of the design. After forming the design tree, at 120, elaboration generates digital drivers, examples of which may be described in Section 12 of IEEE Std 1076.1-2007, referenced above. At 130, elaboration may also form a matrix or a set of matrices representing the components of the differential algebraic equations (DAE), which are solved for the conserved and/or signal flow portion of the design.

Elaboration generates a compilation, which includes a representation of the design in a format which is usable by a simulator to simulate the behavior of the design. The compilation is generated through elaboration based on information included in another representation of the design, such as HDL code, a netlist, or other representation. Once generated, the compilation is stored so as to be accessed by a simulator, or, as discussed in further detail below, modified to incorporate a design change.

Figure 4A:
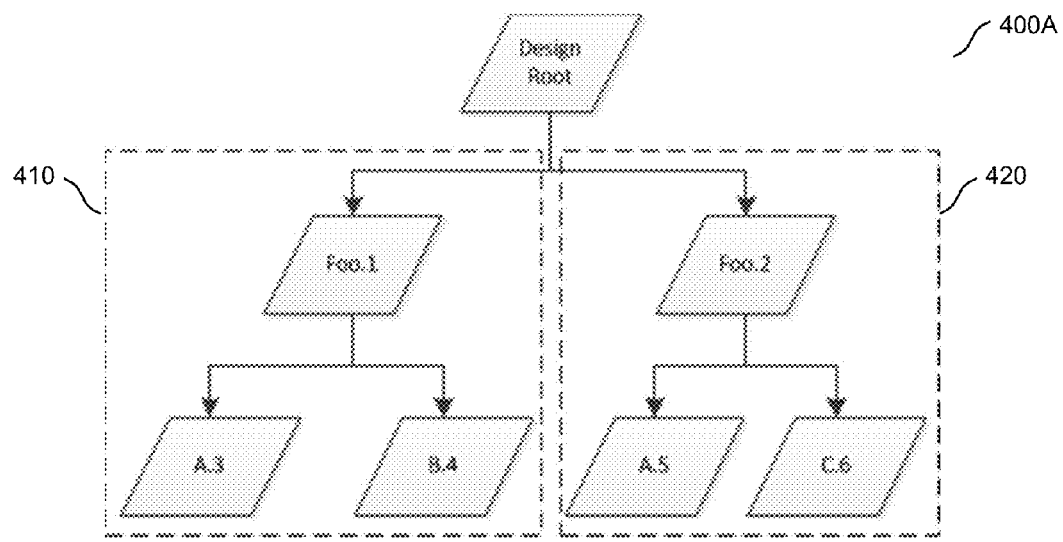
FIG. 4A depicts a simplified exemplary block diagram of a design tree, representing the elaborated design in accordance with one embodiment of the present invention.

One embodiment of the present invention permits the fault simulator to modify the design tree, the system of equations, or other components of the compilation without additional elaboration. The design tree includes a multitude of independent sub-trees as depicted in FIG. 4A and described in greater detail below. The fault simulator may modify at least one of the independent sub-trees of the design tree in response to a change associated with the design. The modification may be done after elaboration without having to recompile or re-elaborate the design by starting over at the design description level. The system has improved simulation efficiency compared to conventional systems because the design does not have to be re-elaborated for each cycle or round of fault analysis simulation.

Still referring to FIG. 1, at 140, the fault simulator may prompt a user for and receive specified design changes during, for example, an iterative fault analysis cycle. In one embodiment, analysis may include a process of optionally receiving and making changes to a design, performing sub-analysis on the design, reducing data, and resetting the design to the design's original condition without the changes. The process elements may be performed repeatedly as part of a single analysis until all the changes have been applied and the results reported. Design changes may include, for example, introducing an element representing a fault, changing an element parameter, and changing a digital signal to simulate conditions that may lead to system problems or failures. Other changes may additionally or alternatively be executed.

In one embodiment, several design changes may be specified simultaneously as a group, and many groups of design changes may be analyzed iteratively. In one embodiment, changes may be run in batched fashion by receiving multiple user specified groups and/or multiple changes at the fault simulator. Analysis cycles are run such that user input is not needed for every analysis iteration. In another embodiment, each analysis iteration may receive a user specified change, and/or the fault simulator may support any combination of batched changes or individual changes.

Further, the independent nature of applying each group of modifications to the design provides control over how simulation runs may be applied. In some embodiments, copies of the design may be created and analysis may be distributed on multiple processors/cores, across multiple machines in a computational grid, and/or in a processing environment in the world wide web cloud to achieve faster computation. For example, one group of changes may run on one processor, while a second different group of changes may run in parallel or concurrently in time on another processor to reduce analysis time.

In one embodiment, in the analysis, before the changes are applied to modify the design, data representative of the change or the original current state of the instantiated tree may be stored in memory and/or the multitude of changes may be saved for later processing. If there are changes to apply, at 150, partial design modification is performed. Examples of partial design modifications are depicted in FIGS. 2A-2E discussed below, and include inserting an element in at least one of the multitude of sub-trees of the design tree. In one embodiment, a structural change may add or remove an instance of an element in the design, or change the number of system variables in the design. In one embodiment, changing a parameter that instantiates one element instead of another element would be equivalent to removing the original instance of the old element and adding an instance of the new element. In one embodiment, partial design modifications may further include modifying the value of a parameter on an existing element, hereinafter also referred to as a "parameter change." Inserted elements may contain analog and/or digital behavior, and may be taken from a model library.

Figure 2A:
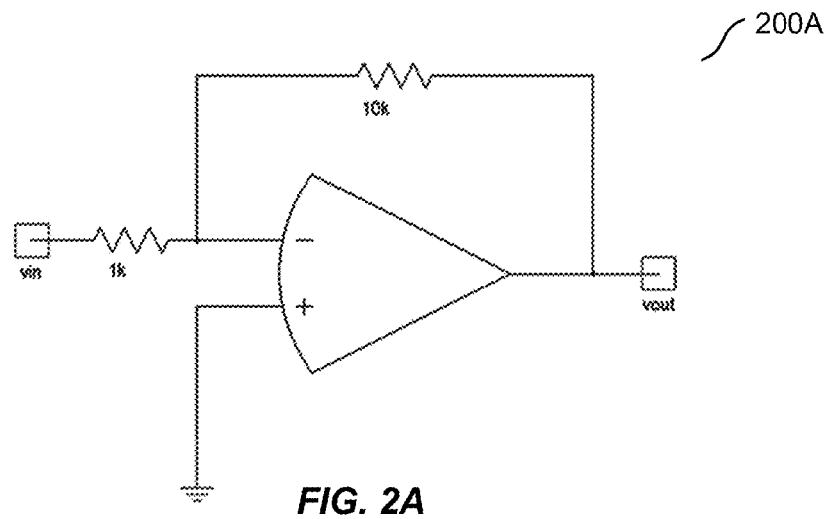
FIG. 2A depicts a simplified exemplary schematic of an amplifier design.

FIG. 2A depicts a simplified exemplary schematic of an amplifier design 200A. Amplifier design 200A includes an op amp, a 1K ohm resistor, and a 10K ohm resistor. The op amp includes a positive input, a negative input, and an output. The 1K ohm resistor is connected between an input, yin, and the negative input of the op amp. The 10K ohm resistor is connected between an output, vout, and the negative input of the op amp. The positive input of the op amp is connected to ground.

Figure 2B:
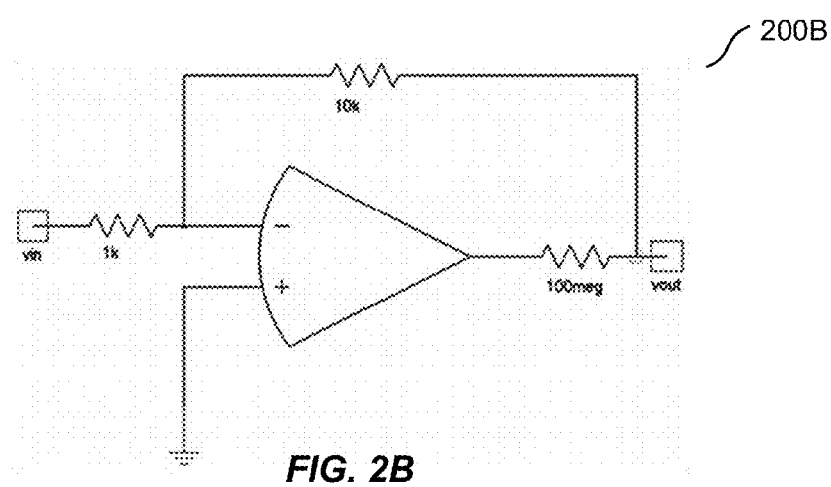
FIG. 2B depicts a simplified exemplary schematic of a series modification to the schematic depicted in FIG. 2A, in accordance with one embodiment of the present invention.

FIG. 2B depicts a simplified exemplary schematic of a series modification 200B to the schematic depicted in FIG. 2A, in accordance with one embodiment of the present invention. The elements depicted in FIG. 2B are similar to the elements depicted in FIG. 2A. FIG. 2B additionally includes a modification which includes an element being inserted in a series connection between a port (vout) and a node (op amp output) connected to the port. This may be referred to as a "serial change." As shown in FIG. 2B, the element is a 100 M ohm resistor between the output port of the op amp and the node connected to vout and the 10K ohm resistor. The 100 M ohm resistor at the output of the op amp may represent an analog open fault, where a node may be disconnected from the port the node is connected to. An example of an analog open may be an electrical open-circuit. In simulation, analog open is sometimes done using a high-resistance element, such as the 100 M ohm resistor, to avoid matrix equations that are difficult to solve.

Figure 2C:
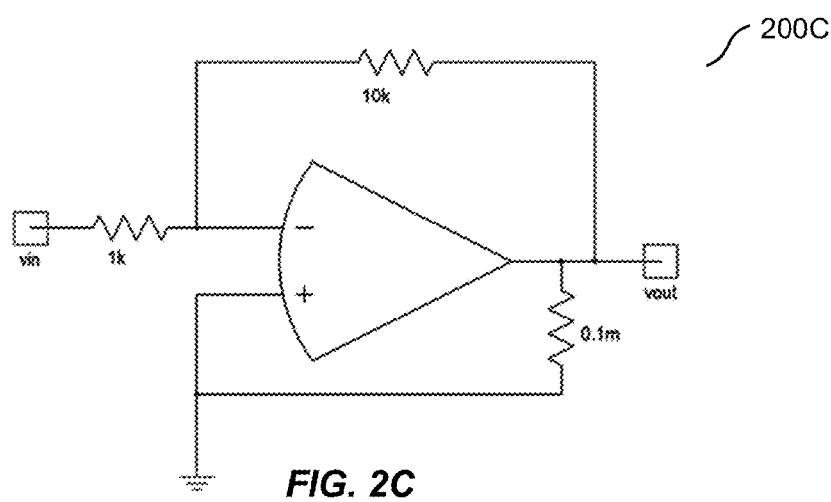
FIG. 2C depicts a simplified exemplary schematic of a parallel modification to the schematic depicted in FIG. 2A, in accordance with one embodiment of the present invention.

FIG. 2C depicts a simplified exemplary schematic of a parallel modification 200C to the schematic depicted in FIG. 2A, in accordance with one embodiment of the present invention. The elements depicted in FIG. 2C are similar to the elements depicted in FIG. 2A. FIG. 2C additionally includes an element inserted in parallel connection between two or more existing nodes, hereinafter also referred to as a "parallel change." In this embodiment, the inserted element is a 0.1 milliohm resistor between the output port of the op amp and the ground node. The 0.1 milliohm resistor between the output of the op amp and ground may represent an analog short connection fault, where a new element is inserted between two nodes where the new element did not previously exist. An example is an electrical short-circuit using a low-resistance element to again help matrix equation convergence to a solution.

Figure 2D:
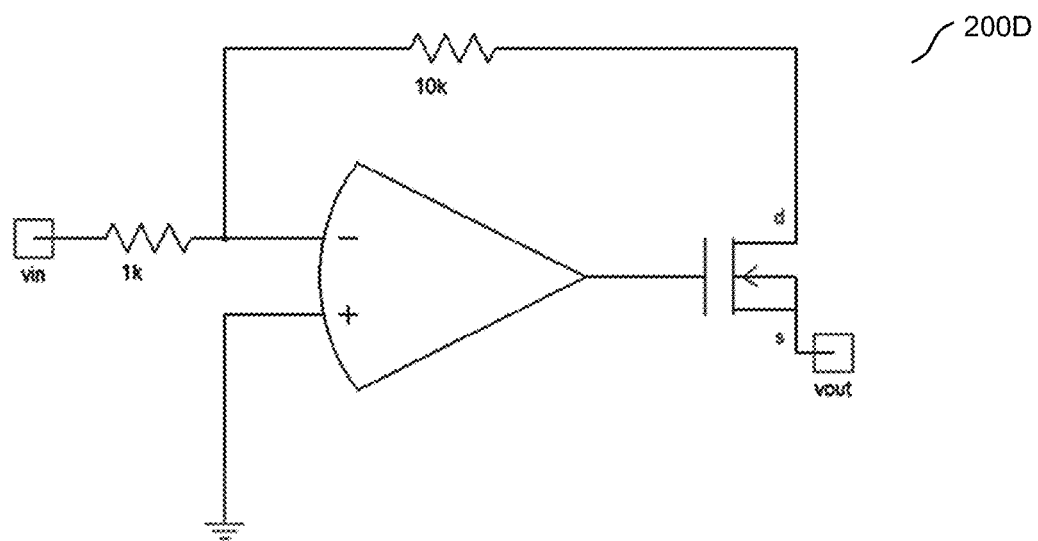
FIG. 2D depicts a simplified exemplary schematic of a series modification associated with 2 ports to the schematic depicted in FIG. 2A, in accordance with one embodiment of the present invention.
Figure 2E:
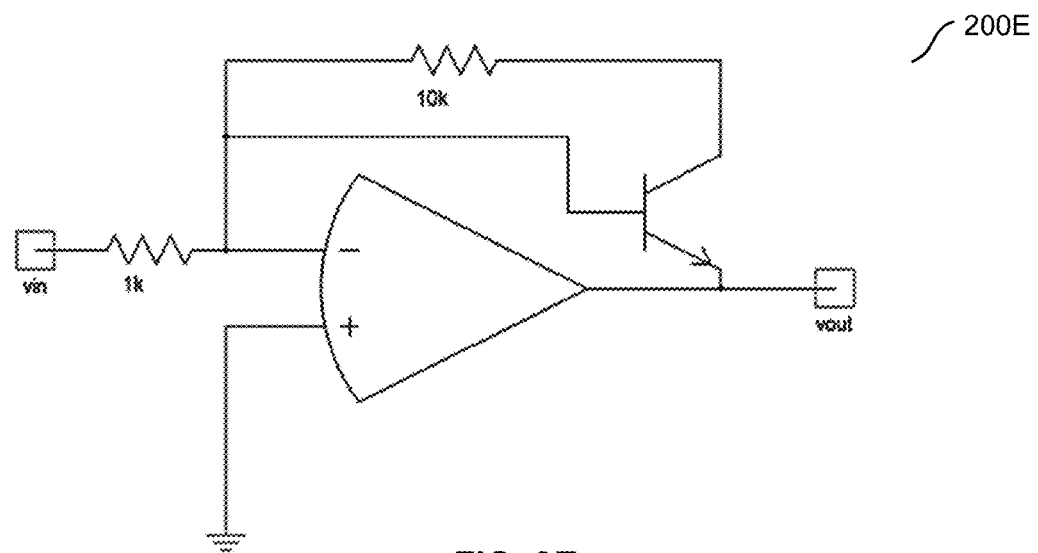
FIG. 2E depicts a simplified exemplary schematic of a series and parallel modification to the schematic depicted in FIG. 2A, in accordance with one embodiment of the present invention.

In practice, inserting an element may be a combination of serial and parallel modifications such as those depicted in FIGS. 2D-2E. FIG. 2D depicts a simplified exemplary schematic of a series modification 200D associated with 2 ports to the schematic depicted in FIG. 2A, in accordance with one embodiment of the present invention. The elements depicted in FIG. 2D are similar to the elements depicted in FIG. 2A. FIG. 2D additionally includes a metal oxide semiconductor (MOS) transistor element connected to the output port of the op amp, to vout, and to the 10K ohm resistor. The gate of the MOS transistor is connected to the output port of the op amp. The source and a body of the MOS transistor are connected to vout. The drain of the MOS transistor is connected to the 10K ohm resistor.

FIG. 2E depicts a simplified exemplary schematic of a series and parallel modification 200E to the schematic depicted in FIG. 2A, in accordance with one embodiment of the present invention. The elements depicted in FIG. 2E are similar to the elements depicted in FIG. 2A. FIG. 2E additionally includes a bipolar transistor element connected to the output port of the op amp, the 10K ohm resistor, and vout. The emitter of the bipolar transistor is connected to the output port of the op amp. The base of the bipolar transistor is connected to the negative input of the op amp. The collector of the bipolar transistor is connected to the 10K ohm resistor.

Referring to FIG. 1 in one embodiment, after partial design modification, at 160, sub-analysis (e.g., a simulation) is performed. Sub-analysis includes solving the DAE and triggering digital and/or event behavior. Examples of sub-analysis may include quiescent, transient, steady state, and alternating current analyses. In one embodiment, sub-analysis involves running one or more sub-analyses. In another embodiment, for sub-analyses that perform transient simulation, where the effects over changing time are analyzed, the parameters of elements may be changed within the design at specified simulation times.

In one embodiment after performing sub-analysis, at 170, the data from the sub-analysis may be analyzed (e.g., reduced) to form a result. Processing on the results of sub-analysis and data reduction may be carried out as part of the iterative analysis loop. In one embodiment, both data generated from the sub-analysis and from processing in the data reduction process may be concurrently written to shared containers using standard practices of writing to a shared data store. In one embodiment after data reduction, at 180, the original design may be restored in the iterative analysis loop using the original state of the instantiated tree and/or the multitude of changes that were previously stored in memory. In one embodiment, the original design may be restored by removing the changes from the modified sub-trees of the design tree.

In one embodiment once there are no further changes to apply to the design, at 190, the analog equations and digital driver connections may be updated and a report may be generated from the combined results of the sub-analyses. In one embodiment, if there are more changes to apply to the design, updating the analog equations and digital driver connections may be delayed until the next Partial Design Modification and the iterative analysis loop may be repeated by prompting the user for additional changes or automatically executing the next group of changes depending on the application or simulation set up.

Figure 3:
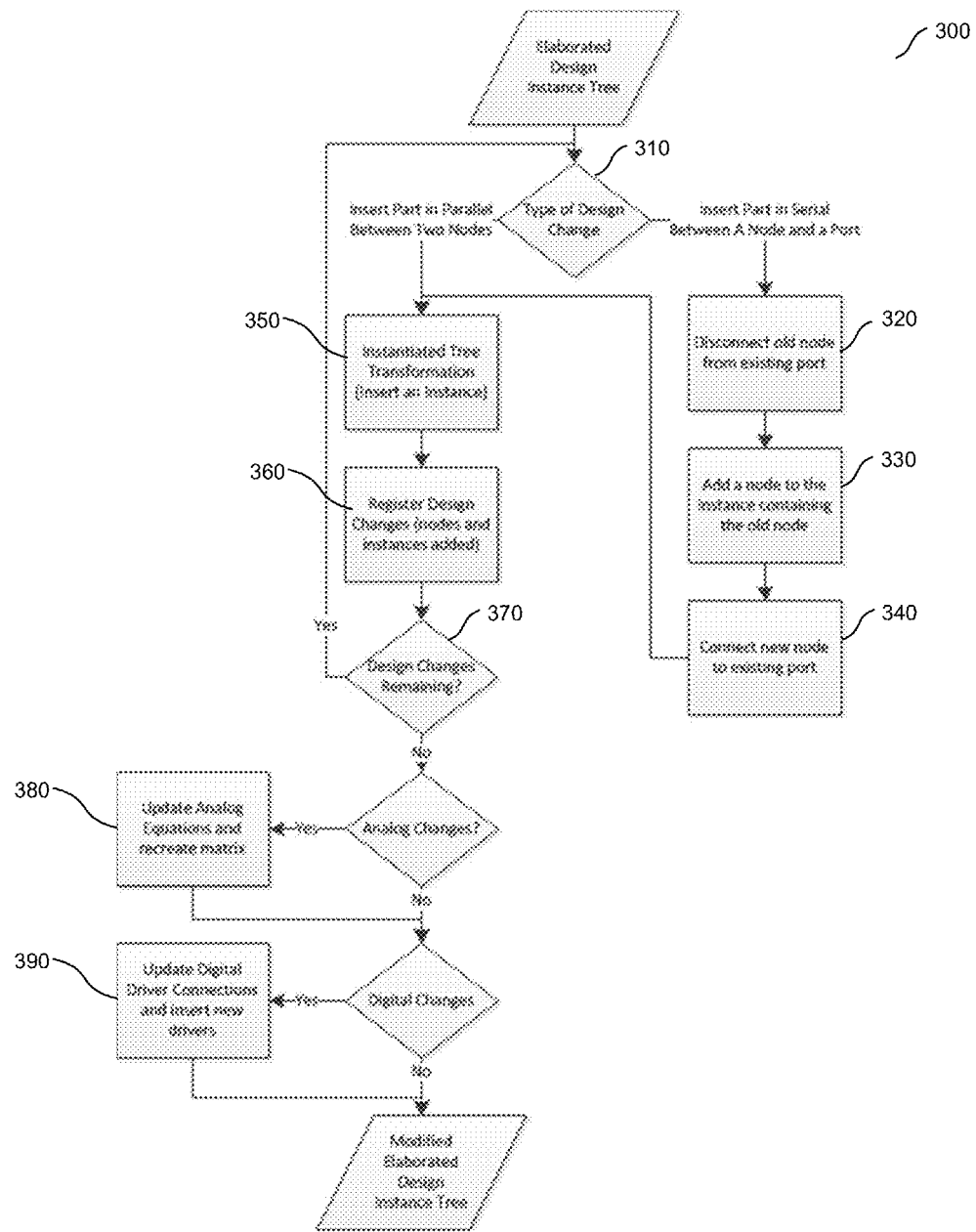
FIG. 3 depicts a simplified flow chart for a partial design modification step depicted in FIG. 1, in accordance with one embodiment of the present invention.

FIG. 3 depicts a simplified flow chart of an embodiment of a partial design modification 150, depicted in FIG. 1, in accordance with one embodiment of the present invention. Inserting elements may be accomplished by modifying the instantiated tree generated during elaboration. At 310, the type of design change is determined. In one embodiment, if the change includes an element being inserted in series between an existing node and a port, before inserting the new element, at 320, the port is disconnected from the existing node. In one embodiment, for example, if the port is an output signal, the port is disconnected from the existing driven node. In one embodiment, for example, if the port is an input signal, the port is disconnected from the existing input node. In some embodiments, serial change behavior may not be defined or implemented if the port is a signal that supports both input and output. Alternatively, in some embodiments, if the port is an input/output port, the input/output port is disconnected from the existing input/output node.

In one embodiment, after disconnecting the port from the existing node, at 330, a new node is added and connected to the port. At 340, if the new node is digital and the port is an output signal, the port may be connected to the new node as a driven signal, and if the new node is digital and the port is an input signal, the new node may be connected to the driven port.

In one embodiment, for either serial or parallel changes, at 350, the element is inserted between the newly created node, and the existing node previously connected to the port. In other words, the instantiated tree is transformed by the inserted element.

As an example, when inserting an element, component instantiation may be generated in the syntax tree between the two nodes specified. In some embodiments, a file representing the compilation is edited. For example, bytecode may be generated from the modified syntax tree to implement the change, for example, by inserting a new instance in the design tree. Accordingly, the compilation may be modified by editing the file representing the compilation, instead of, for example, modifying the design through a graphical or programming code design editing program followed by compilation of the modified design. The instantiated tree transformation may be triggered, for example, by executing the newly-generated bytecode. At 360, the design changes are registered, and nodes and instances added to the compilation. At 370, the process may be repeated until all specified changes in a group have been applied.

In one embodiment, after applying all changes to the instantiated tree, the analog and digital portions of the design are separately updated. If any of the added elements contain analog behavior or if the change is associated with an analog element of the design, at 380, the analog equations associated with the compilation may be updated to reflect the change. In addition, the changes may be propagated through the matrices used to solve those equations. If any of the added elements contain digital behavior or if the change is associated with a digital element of the design, at 390, digital driver connections associated with the compilation may be updated and new drivers may be inserted according to the change. In other words, the driven signals within the new instances may be connected to their drivers, and any new drivers from the new instances are connected to the nodes they drive. The result is an updated version of the instantiated tree that contains all the modifications without recompiling or re-elaborating the design.

FIG. 4A depicts a simplified exemplary graphical representation of the design hierarchy of a design tree, representing the elaborated design in accordance with one embodiment of the present invention. The design tree includes a design root and a first sub-tree indicated by the dashed box 410 at the left of the figure including a model Foo.1, and a second sub-tree indicated by the dashed box 420 at the right of the figure including a model Foo.2. The first sub-tree with model Foo.1 may be independent of the second sub-tree with model Foo.2. Within the design tree, there are two instances of model "A", for example, both derived from the same HDL source code. Both of those instantiations are done within a single model "Foo", which is instantiated twice. Foo is instantiated with different parameters each time, resulting in one instance containing an instantiation of model "B" and the other containing an instantiation of model "C".

Figure 4B:
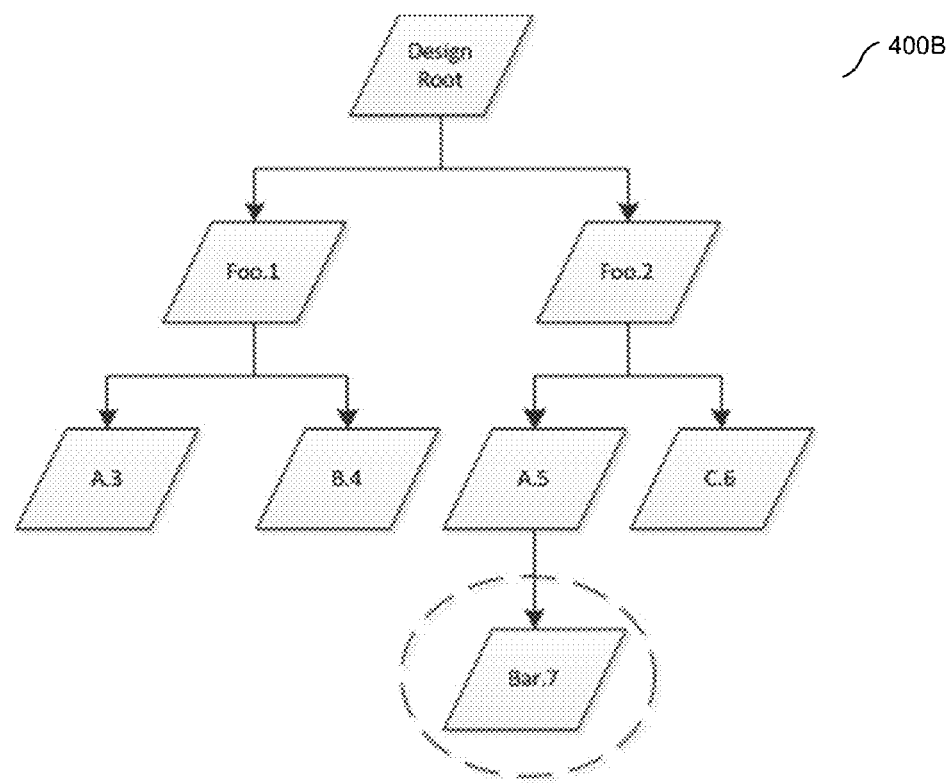
FIG. 4B depicts a simplified exemplary block diagram of the design tree depicted in FIG. 4A with an added element, in accordance with one embodiment of the present invention.

FIG. 4B depicts a simplified exemplary block diagram of the graphical representation of the design hierarchy of the design tree depicted in FIG. 4A with an added element, in accordance with one embodiment of the present invention. The process of transforming the instantiated tree is relatively simple in this example, but demonstrates improvements over making the same changes at the design description level. The elements depicted in FIG. 4B are similar to the elements depicted in FIG. 4A. FIG. 4B also includes an instantiation of "A.5" with different parameters, resulting in one instance containing an instantiation of model "Bar".

FIGS. 4A and 4B are simply graphical representations of the design hierarchy. To modify the compiled design data, in one embodiment, the bytecode may be generated and run to instantiate model "Bar" within the instance "A.5." The result is that the representation of the design in a format for the simulator includes the changes, despite the design not being re-elaborated and recompiled.

To make the same change at the design description level, one would have to create a copy of model "Foo" to use for "Foo.2", make a copy of model "A" to use within the new copy of model "Foo", and make the change to the new copy of model "A" to add an instantiation of model "Bar". Clearly, for more design changes, or a deeper hierarchy, the complexity of modifying the design description can increase quickly. Another approach might be to modify model "A" so that an instantiation of model "Bar" is done for all instances of "A" with the parameters set so the behavior of model "Bar" is disabled, and then modify the parameters of an instance of model "Bar" to enable it. In the inventors' experience, adding instances this way adversely affects the performance of the design. Therefore, the fault simulation performing the change at the design tree level makes the element insertion task more efficient than making the change at the design description level.

Figure 5:
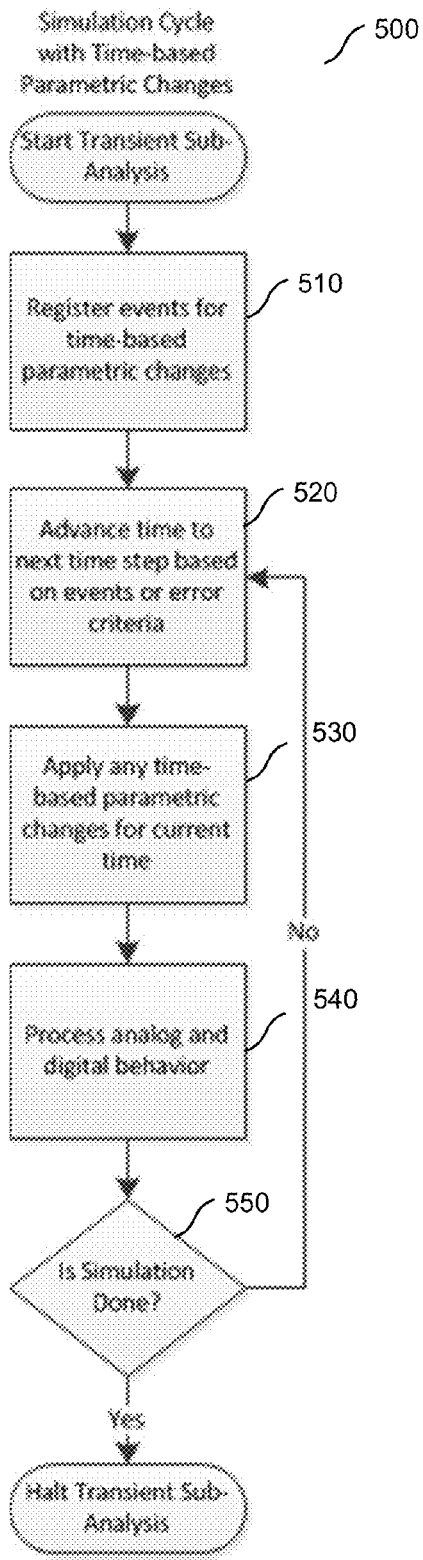
FIG. 5 depicts a simplified flow chart for a sub-analysis step depicted in FIG. 1, in accordance with one embodiment of the present invention.

FIG. 5 depicts a simplified flow chart of an embodiment of a sub-analysis step 160 depicted in FIG. 1, in accordance with one embodiment of the present invention. A sub-analysis may include a simulation cycle such as a transient analysis with time-based parametric changes. At 510, events for time-based parametric changes may be registered. During simulation, the simulation time may be advanced at 520 to the next time step based on events or error criteria.

At 530, time-based parametric changes are applied, for example, based on the current simulation time. The parametric changes may be applied by updating the stored values for the parameters within the instance associated with the parameters within the instantiated tree. Equations that depend on the changed parameters may be updated. In some embodiments, changes that affect the structure of the design are not updating. Any effects of changing the parameters may be propagated, until no more changes are made. For example, in some embodiments, equations of the DAE affected by the changed parameters are updated, and changes are appropriately propagated to update the DAE. Changes that affect the DAE are then applied to the related matrices.

At 540, analog and digital behavior is then processed. At 550, if the simulation is not completed, the process may be repeated starting at 520, with simulation time advancing to the next time step. Once the simulation is completed, the transient analysis may be halted.

Examples of applying partial design modification to fault analysis are described as follows for an analog open, an analog short, a parametric fault, and a stuck signal. The principles and aspects described in these examples and discussed elsewhere herein may be applied to numerous other situations.

An open may be implemented by inserting an element that adds a resistance (or equivalent) in series to the analog circuit. The element may, for example, be parameterized with a resistance value. Accordingly, the resistance of the element may be changed to switch between the fault being disabled and enabled. Resistance values are specified according to the on/off state of the fault, one corresponding with the fault being enabled, and another corresponding with the fault being disabled. The resistance values may be configurable so as to be adapted to the type of design, for example, to improve solution convergence.

A short may be implemented by inserting a element that adds a resistance in parallel to the analog circuit. The element may be parameterized with a resistance value that may be changed between values specified for when the fault is enabled for disabled, for example, as described for the open.

A parametric fault may be implemented by specifying a parameter of an element in the design to change, and the value it should be changed to. When the fault is not enabled, the value of the parameter from before the fault was implemented may be used instead.

A stuck signal may be implemented by removing the connection between the driven signal and any signals driving the driven signal. In addition, a new element may be inserted that drives that signal with the specified stuck value. The new element may be parameterized with the stuck value.

Open, short, and parametric faults may be enabled/disabled at specified times by changing the parameter value of the element associated with the faults. The effects of the changes are propagated throughout the design, and the matrices that represent the equations used to solve the analog portion of the design are reconstructed. The parameter value changes may be applied before calculating the analog solution or propagating digital events from the time point where the fault may be enabled or disabled.

In one embodiment, a stuck signal may be enabled or disabled at a specified time by specifying start and end parameters of the inserted element. These start and end time parameters may be used within the element as times to schedule a digital event that may cause the fault to be enabled or disabled.

An example of an electrical version of a resistor model, written in VHDL is provided below, in accordance with one embodiment of the present invention.

```
-- An ideal resistor for fault insertion.
-- This code was created by Synopsys, Inc. for use with SaberHDL(tm)
-- and other VHDL-AMS simulators.
-- Copyright 2013 - 2013.
library ieee;
use ieee.electrical_systems.all;
entity r_fault_vhdl is
   generic (rnom : real := 0.0); -- nominal resistance
   port (terminal p, m : electrical);
end entity r_fault_vhdl;
architecture simple of r_fault_vhdl is
   quantity v across i through p to m;
begin
   assert rnom /= 0.0
      report "rnom is zero"
      severity error;
   assert rnom >= 0.0
      report "rnom is negative : " & real'image(rnom) & ". Use with
      caution" severity warning;
   i == v / rnom;
end architecture simple;
-- This code is provided "AS is" and with no warranties express or
-- implied. Synopsys is not responsible for any liability arising from the
-- use of this code or the results obtained from it.
```

An example of a digital fault model, written in VHDL is provided below, in accordance with one embodiment of the present invention.

```
-- A model to drive a stuck signal. The input reads the old signal
-- driver and propagates the value when the fault is disabled.
-- This code was created by Synopsys, Inc. for use with
-- SaberHDL(tm) and other VHDL-AMS simulators.
-- Copyright 2013 - 2013.
library ieee;
use ieee.std_logic_1164.all;
entity stuck_fault_vhdl is
   generic (tbegin: time := -1 sec; tend :time := time'high;
faultvalue :std_logic:= '0');
   port (input: in std_logic; output: out std_logic);
end stuck_fault_vhdl;
architecture simple of stuck_fault_vhdl is
   signal faultIndicator :std_logic;
begin
   p:process (input,faultIndicator) is
   begin
      if (now >= tbegin and now < tend) then
         output <= faultvalue;
      else
         output <= input;
      end if;
   end process p;
   p2: process is
begin
   if (tbegin >= 0 sec) then
      faultIndicator <= '1' after tbegin, '0' after tend;
   else
      faultIndicator <= '1';
      faultIndicator <= '0' after tend;
   end if;
   wait;
   end process p2;
end architecture simple;
-- This code is provided "AS is" and with no warranties express or
-- implied. Synopsys is not responsible for any liability arising from
-- the use of this code or the results obtained from it.
```

Figure 6:
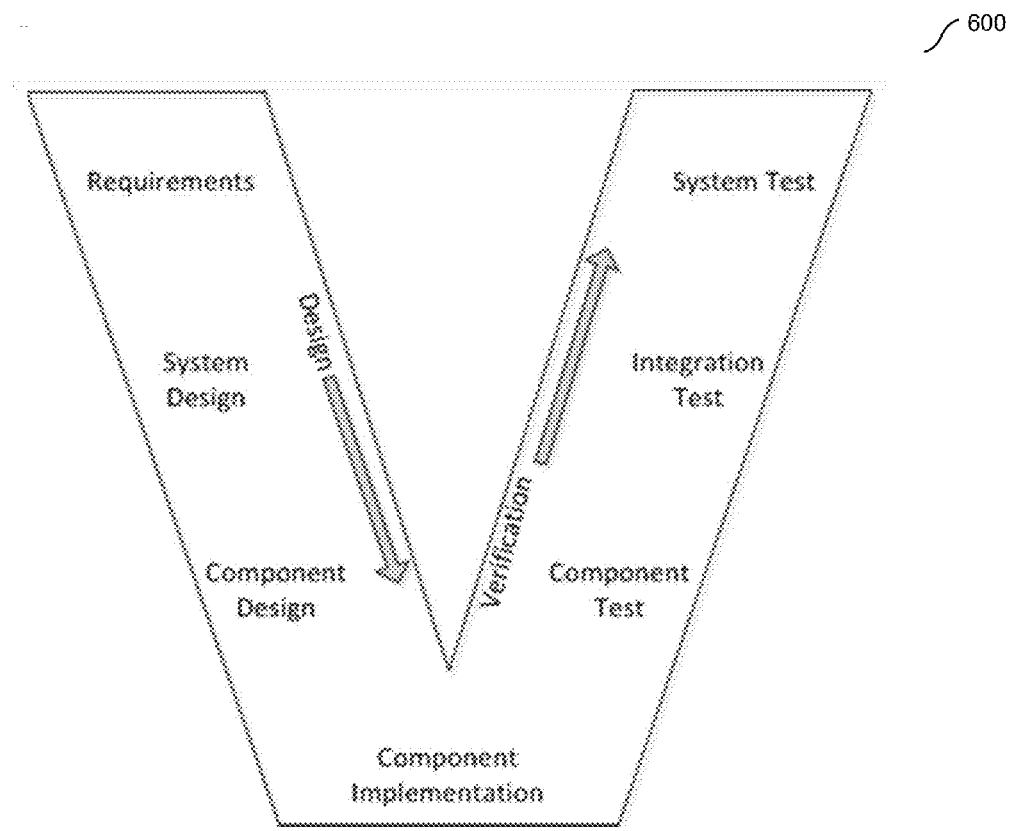
FIG. 6 is a simplified exemplary V-model for systems engineering associated with embodiments of the present invention.

FIG. 6 is a simplified exemplary V-model for systems engineering in which embodiments of the present invention may be used. In one example on the left half of the "V", design flow for an automotive system may begin by determining requirements, such as gather vehicle requirements, how the vehicle should operate, what safety features the vehicle should have, high-level requirements of how the product should be built and behave. Next, system design may determine what systems need to be created to meet the functional design. Some obvious system design pieces may include a gas engine, drive-by-wire steering, and/or the like. Then component design may determine at finer granularity what particular components and electronics are needed for the product. Component design may, for example, include designing the engine itself, creating a wire diagram of the power supply, and/or the like. At the bottom of the "V", component Implementation may create prototypes for the hardware, which may include virtual prototypes, and software.

In the same example on the right half of the "V" that may correspond to system verification, the individual components may be tested once prototypes are created to ensure the components work as expected. Test benches may be created for each component to isolate problems early, so the problems may be fixed more easily. Next, integration test may combine the components into systems and verify that the components work at a system level. Then, the product system as a whole may be tested to ensure the product system meets the requirements for the product. The fault simulator may be associated within the Component Test, Integration Test, and/or System Test portions of this V-model for systems engineering. In one embodiment, a fault simulator having one or more features described herein may operate on a virtual hardware prototype, sometimes interoperating with software control systems, to evaluate the behavior of components and systems of components.

Figure 7:
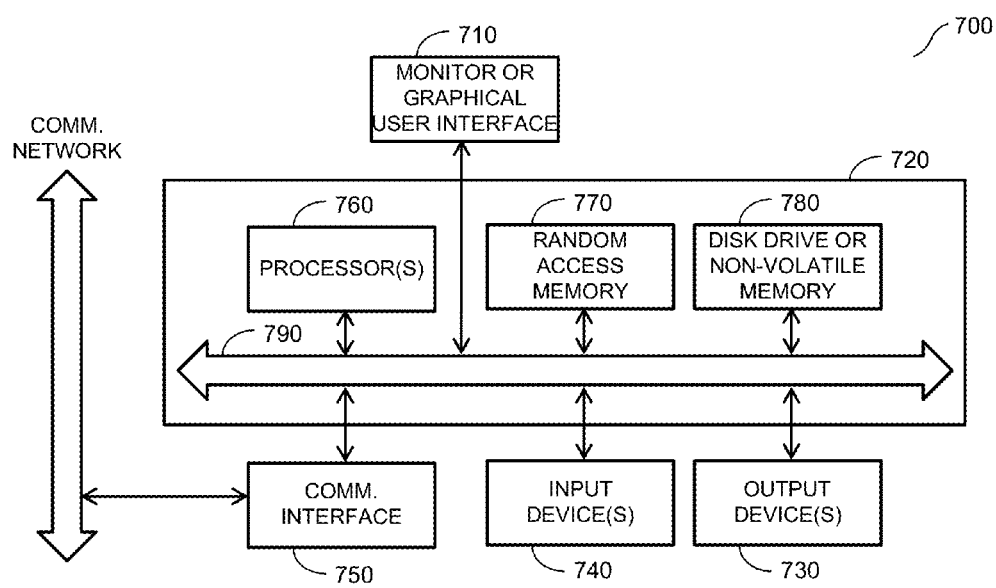
FIG. 7 is a block diagram of a computer system that may incorporate embodiments of the present invention.

FIG. 7 is a block diagram of a computer system that may incorporate embodiments of the present invention. FIG. 7 is merely illustrative of an embodiment incorporating the present invention and does not limit the scope of the invention as recited in the claims. One of ordinary skill in the art would recognize other variations, modifications, and alternatives.

In one embodiment, computer system 700 typically includes a monitor 710, a computer 720, user output devices 730, user input devices 740, communications interface 750, and the like.

As shown in FIG. 7, computer 720 may include a processor(s) 760 that communicates with a number of peripheral devices via a bus subsystem 790. These peripheral devices may include user output devices 730, user input devices 740, communications interface 750, and a storage subsystem, such as random access memory (RAM) 770 and disk drive 780.

User input devices 730 include all possible types of devices and mechanisms for inputting information to computer system 720. These may include a keyboard, a keypad, a touch screen incorporated into the display, audio input devices such as voice recognition systems, microphones, and other types of input devices. In various embodiments, user input devices 730 are typically embodied as a computer mouse, a trackball, a track pad, a joystick, wireless remote, drawing tablet, voice command system, eye tracking system, and the like. User input devices 730 typically allow a user to select objects, icons, text and the like that appear on the monitor 710 via a command such as a click of a button or the like.

User output devices 740 include all possible types of devices and mechanisms for outputting information from computer 720. These may include a display (e.g., monitor 710), non-visual displays such as audio output devices, etc.

Communications interface 750 provides an interface to other communication networks and devices. Communications interface 750 may serve as an interface for receiving data from and transmitting data to other systems. Embodiments of communications interface 750 typically include an Ethernet card, a modem (telephone, satellite, cable, ISDN), (asynchronous) digital subscriber line (DSL) unit, FireWire interface, USB interface, and the like. For example, communications interface 750 may be coupled to a computer network, to a FireWire bus, or the like. In other embodiments, communications interfaces 750 may be physically integrated on the motherboard of computer 720, and may be a software program, such as soft DSL, or the like.

In various embodiments, computer system 700 may also include software that enables communications over a network such as the HTTP, TCP/IP, RTP/RTSP protocols, and the like. In alternative embodiments of the present invention, other communications software and transfer protocols may also be used, for example IPX, UDP or the like.

In some embodiment, computer 720 includes one or more Xeon microprocessors from Intel as processor(s) 760. Further, one embodiment, computer 720 includes a UNIX-based operating system.

RAM 770 and disk drive 780 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, read-only-memories (ROMS), battery-backed volatile memories, networked storage devices, and the like. RAM 770 and disk drive 780 may be configured to store the basic programming and data constructs that provide the functionality of the present invention.

Software code modules and instructions that provide the functionality of the present invention may be stored in RAM 770 and disk drive 780. These software modules may be executed by processor(s) 760. RAM 770 and disk drive 780 may also provide a repository for storing data used in accordance with the present invention.

RAM 770 and disk drive 780 may include a number of memories including a main random access memory (RAM) for storage of instructions and data during program execution and a read only memory (ROM) in which fixed instructions are stored. RAM 770 and disk drive 780 may include a file storage subsystem providing persistent (non-volatile) storage for program and data files. RAM 770 and disk drive 780 may also include removable storage systems, such as removable flash memory.

Bus subsystem 790 provides a mechanism for letting the various components and subsystems of computer 720 communicate with each other as intended. Although bus subsystem 790 is shown schematically as a single bus, alternative embodiments of the bus subsystem may utilize multiple busses.

FIG. 7 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc.; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable storage medium as a set of instructions adapted to direct a processor of a computer system to perform a set of steps disclosed in embodiments of the present invention. The logic may form part of a computer program product adapted to direct an information-processing device to automatically perform a set of steps disclosed in embodiments of the present invention. Based on the disclosure and teachings provided herein, a person of ordinary skill in the art will appreciate other ways and/or methods to implement the present invention, for example by writing source code an compiling the source code to generate instructions executable by the computer.

The specification and drawings are, accordingly, to be regarded in an illustrative rather than a restrictive sense.

However, it will be evident that various modifications and changes may be made thereunto without departing from the broader spirit and scope of the invention as set forth in the claims. In addition, the technique and system of the present invention is suitable for use with a wide variety of electronic design automation (EDA) tools and methodologies for designing, testing, and/or manufacturing systems characterized by a combination of conserved, signal flow, and event or digital system of equations. The scope of the invention should, therefore, be determined not with reference to the above description, but instead should be determined with reference to the pending claims along with their full scope or equivalents.

What is claimed is:

1. A computer implemented method of verifying a design of an integrated circuit, the method comprising:
   accessing, via the computer, a stored compilation representing the design;
   causing the computer to generate a modified version of the stored compilation in response to an indication of a change to a portion of the design without re-elaborating the design; and
   simulating the modified version of the stored compilation to verify the design, wherein the modified version of the stored compilation includes a design tree comprising a plurality of sub-trees and wherein generating the modified version comprises inserting an element into one of the sub-trees.

2. The method of claim 1, further comprising identifying a portion of the compilation representing the changed portion of the design, wherein the modified compilation comprises a modified version of the identified portion of the compilation, and wherein other portions of the compilation remain unmodified.

3. The method of claim 1, wherein the change comprises at least one of adding a short element to the design and adding an open element to the design.

4. The method of claim 1, wherein generating the modified version comprises:
   determining that the change is related to an analog element; and
   updating at least one analog equation associated with the element.

5. The method of claim 1, wherein generating the modified version comprises:
   determining that the change is related to a digital element; and
   updating at least one digital driver connection associated with the element.

6. The method of claim 1, wherein the inserting comprises:
   disconnecting a first node from a port connected to the node;
   adding a second node between the first node and the port;
   connecting the second node to the port; and
   inserting the element between the first node and the second node.

7. The method of claim 1, further comprising:
   generating a report based on the simulation.

8. The method of claim 1, further comprising restoring the modified compilation to its unmodified state.

9. A system for verifying a design of an integrated circuit, the system comprising:
   a processor, and
   a memory storing instructions, which, when executed by the processor cause the processor to:
   access a stored compilation representing the design;
   generate a modified version of the stored compilation in response to an indication of a change to a portion of the design without re-elaborating the design; and
   simulate the modified version of the stored compilation to verify the design, wherein the modified version of the stored compilation includes a design tree comprising a plurality of sub-trees and wherein the modified version comprises an element inserted into one of the sub-trees.

10. The system of claim 9, wherein the instructions further cause the processor to identify a portion of the compilation representing the changed portion of the design, wherein the modified compilation comprises a modified version of the identified portion of the compilation, and wherein other portions of the compilation remain unmodified.

11. The system of claim 9, wherein the change comprises at least one of adding a short element to the design and adding an open element to the design.

12. The system of claim 9, wherein the instructions further cause the processor to:
   determine that the change is related to an analog element, and
   update at least one analog equation associated with the element; and determining that the change is related to a digital element.

13. The system of claim 9, wherein the instructions further cause the processor to:
   disconnect a first node from a port connected to the node;
   add a second node between the first node and the port;
   connect the second node to the port; and
   insert the element between the first node and the second node.

14. The system of claim 9, wherein the instructions further cause the processor to:
   generate a report based on the simulation.

15. The system of claim 9, wherein the instructions further cause the processor to restore the modified compilation to its unmodified state.

16. The system of claim 9, wherein the instructions further cause the processor to:
   determine that the change is related to a digital element; and
   update at least one digital driver connection associated with the element.

* * * * *